US012789232B2

(12) United States Patent
Peters et al.

(10) Patent No.: US 12,789,232 B2
(45) Date of Patent: Nov. 10, 2026

(54) PIEZOELECTRIC DEVICE WITH PILLAR STRUCTURE AND USE THEREOF

(71) Applicant: Nederlandse Organisatie voor toegepast-natuurwetenschappelijk onderzoek TNO, 's-Gravenhage (NL)

(72) Inventors: Laurens Christiaan Johannes Maria Peters, Wijchen (NL); Jan-Laurens Pieter Jacobus Van Der Steen, Eindhoven (NL); Roy Gerardus Franciscus Verbeek, Eindhoven (NL); Paul Louis Maria Joseph Van Neer, Bergschenhoek (NL); Gerwin Hermanus Gelinck, Valkenswaard (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 1116 days.

(21) Appl. No.: 17/800,381

(22) PCT Filed: Feb. 4, 2021

(86) PCT No.: PCT/NL2021/050069
§ 371 (c)(1),
(2) Date: Aug. 17, 2022

(87) PCT Pub. No.: WO2021/167446
PCT Pub. Date: Aug. 26, 2021

(65) Prior Publication Data

US 2023/0076265 A1 Mar. 9, 2023

(30) Foreign Application Priority Data

Feb. 21, 2020 (EP) .................................... 20158759

(51) Int. Cl.
*B06B 1/06* (2006.01)
*H01L 41/193* (2006.01)
(Continued)

(52) U.S. Cl.
CPC ......... *B06B 1/0692* (2013.01); *H10N 30/045* (2023.02); *H10N 30/084* (2023.02); *H10N 30/098* (2023.02); *H10N 30/857* (2023.02)

(58) Field of Classification Search
CPC .. B06B 1/0692; H10N 30/045; H10N 30/084; H10N 30/098; H10N 30/857
See application file for complete search history.

(56) References Cited

U.S. PATENT DOCUMENTS

| | | | |
|---|---|---|---|
| 2005/0156491 | A1 | 7/2005 | Scott |
| 2010/0239133 | A1 | 9/2010 | Schmitt et al. |

(Continued)

FOREIGN PATENT DOCUMENTS

| | | | |
|---|---|---|---|
| CA | 2026053 | A1 | 3/1991 |
| CN | 1213895 | A | 4/1999 |

(Continued)

OTHER PUBLICATIONS

China National Intellectual Plroperty Administration, Notice of Allowance in corresponding Chinese Application No. 202180015899.2 dated Nov. 3, 2025.

(Continued)

*Primary Examiner* — Emily P Pham
*Assistant Examiner* — Monica Mata
(74) *Attorney, Agent, or Firm* — Leydig, Voit & Mayer, Ltd.

(57) ABSTRACT

A piezoelectric device and method of manufacturing are described. A first substrate is provided with an array of pillars comprising piezoelectric material. A second substrate is provided with a piezoelectric layer facing respective ends
(Continued)

of the pillars. The respective ends of the pillars are pushed into the piezoelectric layer, while the piezoelectric layer is at least partially liquid. The piezoelectric layer is solidified to form an integral connection between the piezoelectric layer and the pillars. The piezoelectric layer can thus form a bridging structure between the respective ends of the pillars. The integral piezoelectric structure can be poled by high voltage. The bridging structure can act as a platform for depositing electrical contacts. The piezoelectric device can be used for generating or detecting acoustic waves, e.g. in medical imaging.

8 Claims, 8 Drawing Sheets

(51) Int. Cl.

| | |
|---|---|
| ***H01L 41/257*** | (2013.01) |
| ***H01L 41/333*** | (2013.01) |
| ***H01L 41/45*** | (2013.01) |
| ***H10N 30/045*** | (2023.01) |
| ***H10N 30/084*** | (2023.01) |
| ***H10N 30/098*** | (2023.01) |
| ***H10N 30/857*** | (2023.01) |

(56) References Cited

U.S. PATENT DOCUMENTS

| | | | | |
|---|---|---|---|---|
| 2010/0314968 | A1 | 12/2010 | Mohamadi | |
| 2011/0298872 | A1 | 12/2011 | Hayashi | |
| 2015/0236620 | A1 | 8/2015 | Shao et al. | |
| 2020/0204089 | A1 * | 6/2020 | Mahmud .................. | H02N 2/22 |

FOREIGN PATENT DOCUMENTS

| | | | |
|---|---|---|---|
| CN | 1610979 | A | 4/2005 |
| CN | 103035835 | A | 4/2013 |
| CN | 104584248 | A | 4/2015 |
| CN | 108447884 | A | 8/2018 |
| CN | 110138263 | A | 8/2019 |
| EP | 0707898 | A2 | 4/1996 |
| EP | 2264802 | A1 | 12/2010 |
| JP | 2007513504 | A | 5/2007 |
| JP | 2008244859 | A | 10/2008 |
| JP | 2011255578 | A | 12/2011 |
| JP | 2012521658 | A | 9/2012 |
| JP | 2012524986 | A | 10/2012 |
| JP | 2014-177099 | A | 9/2014 |
| TW | 201946380 | A | 12/2019 |
| WO | 2009113432 | A1 | 9/2009 |

OTHER PUBLICATIONS

European Patent Office, Office Action in corresponding European Application No. 21704036.9, dated Sep. 25, 2014.

China National Intellectual Plroperty Administration, First Office Action in corresponding Chinese Application No. 2021-80015899.2 dated Jun. 30, 2025.

European Patent Office, International Search Report in corresponding International Application No. PCT/NL2021/050069, dated Mar. 29, 2021 (2 pages).

Japanese Patent Office, Notice of Allowance in corresponding Japanese Patent Application No. 2022-550657 dated Jun. 11, 2025 (no translation available).

Japanese Patent Office, Notice of Reasons for Refusal in corresponding Japanese Application No. 2022-550657 dated Oct. 17, 2024.

Taiwanese Patent Office, Examination Report in corresponding Taiwanese Application No. 110105539 dated Sep. 12, 2024.

* cited by examiner

PIEZOELECTRIC DEVICE WITH PILLAR STRUCTURE AND USE THEREOF

CROSS-REFERENCE TO RELATED APPLICATIONS

This patent application is a U.S. National Phase of PCT International Application No. PCT/NL2021/050069, filed Feb. 4, 2021, which claims priority to European Application No. 20158759.9, filed Feb. 21, 2020, which are both expressly incorporated by reference in their entireties, including any references contained therein.

TECHNICAL FIELD AND BACKGROUND

The present disclosure relates to devices, such as acoustic transducers, comprising pillar structures of piezoelectric material, and methods of manufacturing such devices.

For example, pillar structures can be advantageous in lowering acoustical and/or mechanical cross coupling between elements in an acoustic device. In one publication Chen et al. [DOI: 10.1039/C5NR01746G] describes High Performance P(VDF-TrFE) Nanogenerator with Self-Connected and Vertically Integrated Fibers by Patterned EHD Pulling. In another publication Chen et al. [DOI: 10.1002/smll.201604245] describes High-Performance Piezoelectric Nanogenerators with Imprinted P(VDF-TrFE)/BaTiO3 Nanocomposite Micropillars for Self-Powered Flexible Sensors. In another publication Xu et al. [DOI: 10.1117/12.817028] describes Design and Microfabrication of a PVDF Acoustic Sensor.

There remains a need for further improvement in manufacturing and use of piezoelectric devices, e.g. having robust structures compatible with various manufacturing and post-processing steps.

SUMMARY

Aspects of the present disclosure relate to piezoelectric devices and methods of manufacturing. As described herein, the piezoelectric device comprises an array of pillars comprising piezoelectric material. Typically, the pillars are disposed on a substrate. A piezoelectric layer can be integrally connected with the pillars on respective ends of the pillars opposite the substrate. For example, the piezoelectric layer forms a bridging structure acting as a platform of piezoelectric material between the respective ends of the pillars. Such a device can be manufactured by pushing a substrate with an array of the piezoelectric pillars into a layer of liquefied piezoelectric material, which can be provided on another substrate. When the piezoelectric material is solidified, an integral connection can be formed there between. The solidified piezoelectric layer can thus form a bridging structure between the respective ends of the pillars. Advantageously, the bridging structure of piezoelectric material can be used as a platform for easy placement of further electrical components and structure. By using the same or similar material for both the pillars and bridge layer, the structure can form an integral structure with uniform electromechanical properties.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1A:
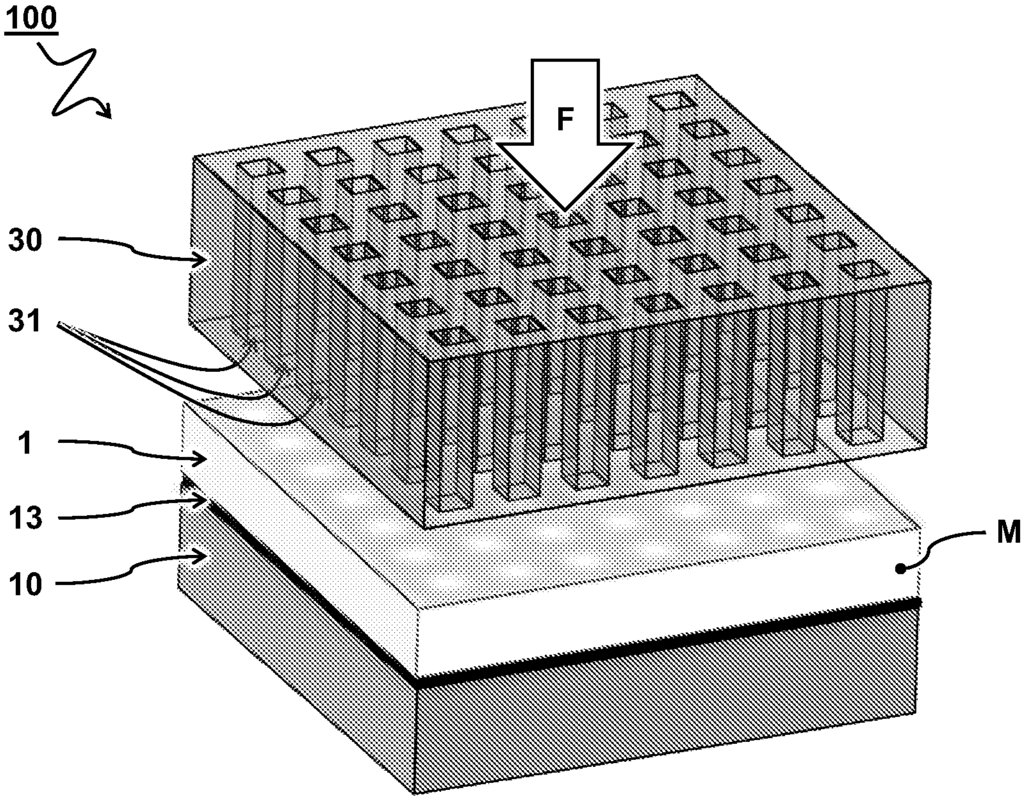
FIGS. 1-6 illustrate a piezoelectric device and steps in the manufacturing thereof.

Terminology used for describing particular embodiments is not intended to be limiting of the invention. As used herein, the singular forms “a”, “an” and “the” are intended to include the plural forms as well, unless the context clearly indicates otherwise. The term “and/or” includes any and all combinations of one or more of the associated listed items. It will be understood that the terms “comprises” and/or “comprising” specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1B:
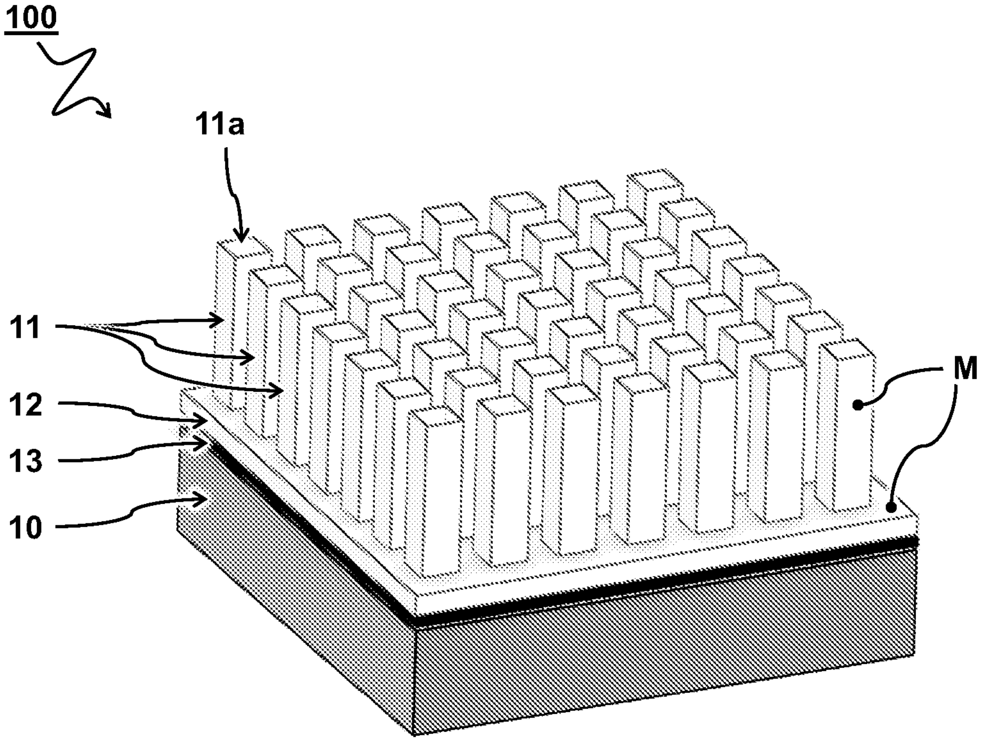

FIGS. 1A and 1B illustrate forming an array of pillars 11 by molding (F). In one embodiment, e.g. as shown, the formation comprises pushing a mold structure 30 with mold openings 31 into a precursor layer 1 on a first substrate 10. While the openings 31 are shown in the figure as extending through the mould structure 30, these can of course also be closed on top. Accordingly, the piezoelectric material “M” of the precursor layer 1 can be pushed into respective mold openings 31 to form respective pillars 11. In some embodiments, the piezoelectric material “M” in the precursor layer 1 is softened, e.g. by heating, prior to and/or during the molding. This may facilitate deforming the material in the shape of pillars. The material of the pillars may solidified, e.g. by active or passive cooling, before removing the mold.

Also other ways of forming an array of piezoelectric pillars as described herein can be envisaged. For example, in some embodiments (not shown), piezoelectric material “M” of the precursor layer 1 is cut away according to a grid of lines to form the pillars 11 there between. For example, the material can be cut by a physical cutting tool, laser or other exposure, optionally followed by etching. It can also be envisaged to produce the pillars by additive manufacturing.

Yet further methods to produce the pillars may include electro-hydrodynamic pulling.

In some embodiments, e.g. as shown, the first substrate 10 forms a support structure under the array of pillars 11. Typically, the first substrate 10 is of a different material than the pillars, e.g. not a piezoelectric material. For example, the first substrate 10 comprises a plastic, glass, or silicon substrate. Alternatively, the first substrate 10 may itself comprise piezoelectric material "M" essentially being formed only by the precursor layer 1. By using a flexible substrate as the first substrate 10, it may be easier to separate the mold structure 30 from the pillars 11 after formation. Alternatively, or in addition, also the mold structure 30 can be flexible.

In a preferred embodiment, e.g. as shown, the lengths of the pillars 11 have a direction perpendicular to a plane of the first substrate 10, with the respective ends facing away from the first substrate 10 (towards the piezoelectric layer 21). Alternatively, or additionally, it can be envisaged that some, or all pillars are directed at an angle with respective to a surface normal of the first and/or second substrate.

In a preferred embodiment, electrical connections and/or components are incorporated in or on the first substrate 10. For example, these can be formed lithographically, e.g. on a silicon or other material substrate. In some embodiments, one or more further layers are formed between the precursor layer 1 and the first substrate 10. For example, the additional layers may have an electrical or other function. Preferably, at least a first electrode 13 is formed between the pillars 11 and the first substrate 10 for applying an electric potential (voltage) to the piezoelectric material "M". For example, the first electrode 13 comprises a conductive layer, e.g. metal, which may be patterned or not. In some embodiments, the first electrode 13 is a common electrode to apply the same voltage to all of the pillars. For example, the first electrode 13 is a continuous metal layer that runs under all the pillars. In other or further embodiments, the first electrode 13 is subdivided to individually address (apply a respective voltage to) one pillar, or multiple pillars, e.g. a subset of all pillars. For example, one electrode may cover a collection or cluster of adjacent pillars.

In other or further embodiments, the first substrate 10 is removed in a similar way as described herein with reference to the second substrate 20. For example, as shown, a residual part of the precursor layer 1 after molding can form a second piezoelectric layer 12. The second piezoelectric layer 12 can also be formed in other ways, e.g. as a separate layer or added later similar to the first piezoelectric layer 21. If the first substrate 10 is removed this can act as another platform between the pillars 11 similar to the piezoelectric layer 21 on the other side. Accordingly, electrical connections can be formed also after removing the first substrate 10, or the intermediate layer with electrical connection can remain on the second piezoelectric layer 12 while the substrate is removed. Alternatively, or additionally to serving as a platform, the second piezoelectric layer 12 can also have other functions, irrespective whether the first substrate 10 is removed or not. For example, the second piezoelectric layer 12 can help to stabilize the construction of pillars 11 and/or their connection to the first substrate 10 or intermediate layer, e.g. first electrode 13.

Figure 2A:
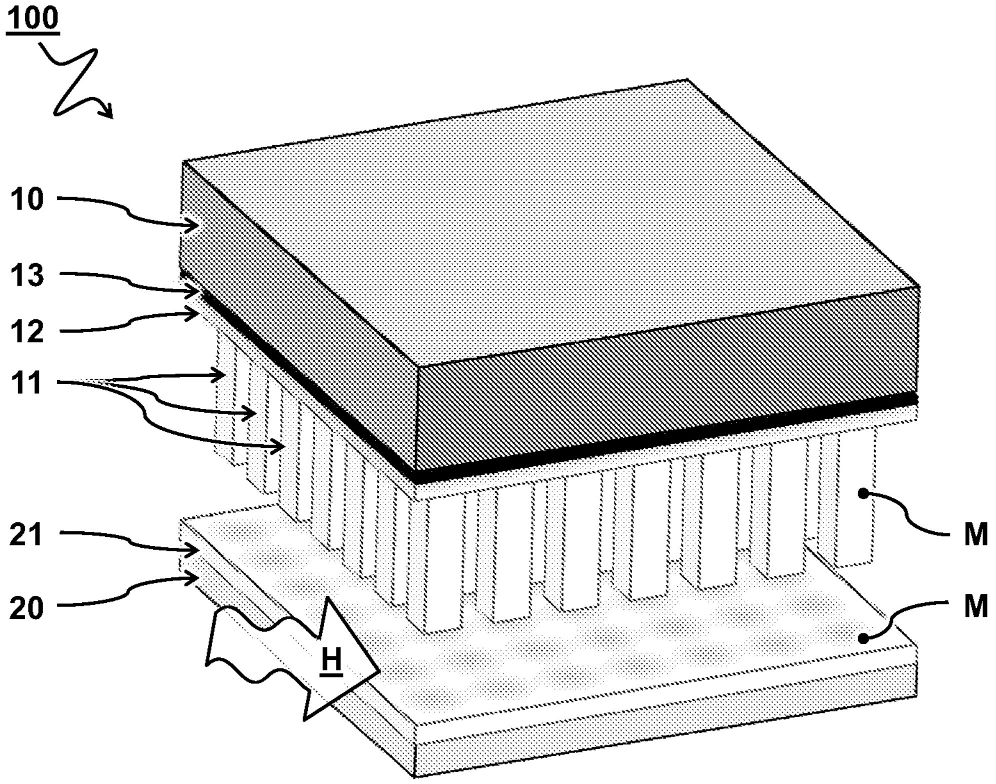
Figure 2B:
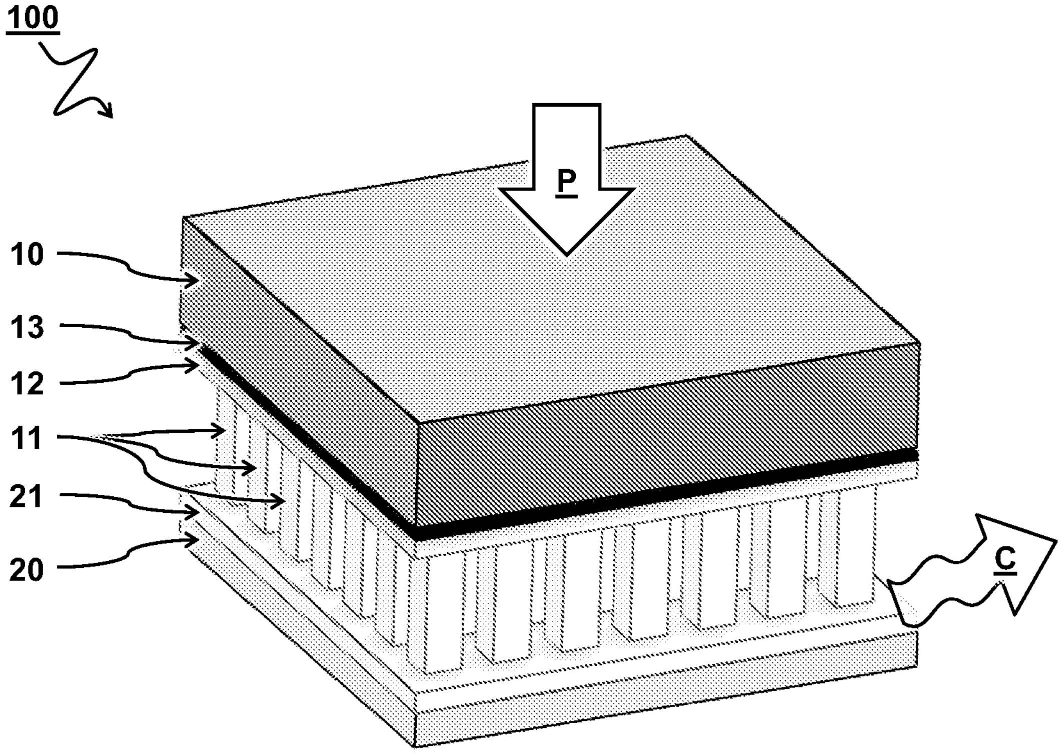

FIGS. 2A and 2B illustrate applying a piezoelectric layer 21 onto an array of piezoelectric pillars 11. In a preferred embodiment, a first substrate 10 is provided with an array of pillars 11 comprising piezoelectric material "M", and a second substrate 20 with a piezoelectric layer 21 facing respective ends of the pillars 11. In another or further preferred embodiment, the respective ends of the pillars 11 are pushed (P) into the piezoelectric layer 21, while the piezoelectric layer 21 is at least partially liquid. In some embodiments, the piezoelectric layer 21 is solidified to form an integral connection between the piezoelectric layer 21 and the pillars 11. Accordingly, the piezoelectric layer 21 can form a bridging structure between the respective ends of the pillars 11.

Various ways can be envisaged for creating the bridging structure or platform. In preferred embodiments, the pillars are pressed lightly onto a substrate containing a thin film bridge which is "wet", e.g. liquid having relatively low viscosity. For example, the viscosity of the at least partially liquid piezoelectric layer 21 is less than $10^6$ mPa·s (comparable to peanut butter), or less than $10^4$ mPa·s (comparable to honey), or less than $10^2$ mPa·s (e.g. like olive oil), down to 1 mPa·s (water), or less. For example, the piezoelectric layer 21 can be "wet" or liquid because the bridging layer is in solution, non-crosslinked (uncured) or is soft due to being around its melting (or glass transition) temperature. This may depend on the type of piezoelectric material "M".

When the pillars have been pressed in, the layer can be dried, cured or cooled to form the lasting bridging structure. For example, this may drastically increase the viscosity by a factor hundred, thousand, or more, most preferably where the piezoelectric layer 21 acts as a solid. By solidifying the at least partially liquid piezoelectric layer 21 while the pillars 11 are pushed into the layer, a permanent (or at least sufficiently durable) connection can be formed there between. Thereafter, the pillars 11 and piezoelectric layer 21 can form an essentially monolithic or integral piece of piezoelectric material "M".

Depending on a viscosity and thickness of the "wet" piezoelectric layer 21, the pillars can be pressed into the layer with a certain force. Typically a certain volume of the wet thin film can move into a spacing between the pillars. Effectively this may reduce a height of the pillars. To a certain degree, this effect can be desired, since it promotes adhesion between the pillars and the bridging layer. In some embodiments, e.g. when the film is relatively thin compared to the pillars height, the pillars can even be pressed all the way down to touch the wet thin film's substrate. For example, at this point, no further movement may occur and the wet thin film does not get any further into the space between the pillars. In other or further embodiments, e.g. when it is not desired to decrease the effective pillar height, a limited amount of pressure can be exerted, depending on the wet film viscosity. In some cases, the weight of the first substrate 10, e.g. glass plate, containing the pillars is enough.

In a preferred embodiment, the piezoelectric layer 21 comprises essentially the same piezoelectric material "M" as the pillars 11. By using the same material, the piezoelectric layer 21 and pillars 11 may have similar properties and/or the connection there between may be improved. For example, when the combined structure is actuated by applying an electric field, the resulting deformation of the piezoelectric material "M" can be the same or similar in respective parts of piezoelectric layer 21 and pillars 11. Also the connection can be completely integrated In a preferred embodiment, the piezoelectric material "M" of the pillars 11 and piezoelectric layer 21 each comprises (or essentially consists of) piezoelectric polymers. Most preferably, the piezoelectric material comprises or essentially consists of a polymeric or a composite polymeric/ceramic material. Examples of polymeric piezoelectric materials may include PVDF and its co-polymers, polyamides, liquid crystal polymers, polyimide and polyvinylidenechloride PVDC. Examples of composite polymeric/ceramic materials may include BaTiO3, PZT, ZnO or PMN-PT within a polymeric mediums such as PVDF, epoxy, SU8 and PDMS.

In a preferred embodiment, the piezoelectric layer 21 is melted by applying heat (H) until it is at least partially liquefied. Most preferably the heat H is applied to the piezoelectric layer 21, but not to the pillars 11. In this way, the structural integrity of the piezoelectric layer 21 can be better maintained. Most preferably the heat H is applied to the piezoelectric layer 21 before, but not during, the step of pushing P the pillars 11 into the piezoelectric layer 21.

In some embodiments, an internal heat source (e.g. as part of the second substrate, not shown) can be used to heat the piezoelectric layer 21. In other or further embodiments, the heat H is applied by an external heat source (also not shown). For example, (only) the second substrate 20 with the piezoelectric layer 21 is placed in an oven to apply the heat H (e.g. while the first substrate 10 remains unheated). Alternatively, or in addition, heat H is applied by a (directional) radiation source, e.g. irradiating the piezoelectric layer 21 with infrared or other radiation. In one embodiment, the heat H is applied exclusively, or primarily, to the piezoelectric layer 21.

In one embodiment, e.g. as shown in FIG. 2B, the melted piezoelectric layer 21 is solidified by cooling (C) after the connection is made with the pillars 11 to form an integral connection therewith. For example, the material of the piezoelectric layer 21 may solidified by active or passive cooling. Alternatively, or in addition to melting, in some embodiments, the at least partially liquid or wet piezoelectric layer 21 comprises uncured (non-cross linked) piezoelectric material "M". For example, the pillars 11 are pushed into the uncured piezoelectric layer 21 where after the piezoelectric layer 21 is solidified by curing. For example, the piezoelectric layer 21 is cured by heat and/or electromagnetic radiation, e.g. UV light to promote cross-linking in the piezoelectric material "M". In yet other or further embodiments, the at least partially liquid or wet piezoelectric layer 21 comprises or is formed by a solution with the piezoelectric material "M". For example, the pillars 11 are pushed into a liquid solution of the piezoelectric layer 21 where after the solution is solidified by drying. For example, the piezoelectric layer 21 is actively or passively dried leaving a solid structure when the solvent is removed. Also combination of drying and curing can be envisaged, e.g. when the solution comprises uncured piezoelectric material "M", which is cured after the solvent is removed. It can also be envisaged to apply the piezoelectric material "M" in solution, and melt the material after drying.

In a preferred embodiment, the respective ends of the pillars 11 are disposed in a downward facing position when they are pushed P into the at least partially melted piezoelectric layer 21. By allowing the pillars 11 to hang down from the first substrate 10 (in the direction of gravitational force), they can better maintain shape, even if they would start melting, e.g. by indirect heat from the piezoelectric layer 21. In another or further embodiment, the piezoelectric layer 21 is preferably disposed on top of the second substrate 20 in an upward facing position or direction. Advantageously, in this orientation melted material of the piezoelectric layer 21 can remain on the second substrate 20 without dripping between the pillars 11. After the piezoelectric layer 21 is sufficiently solidified, the connected structure can be flipped over, e.g. for subsequent processing.

Figure 3A:
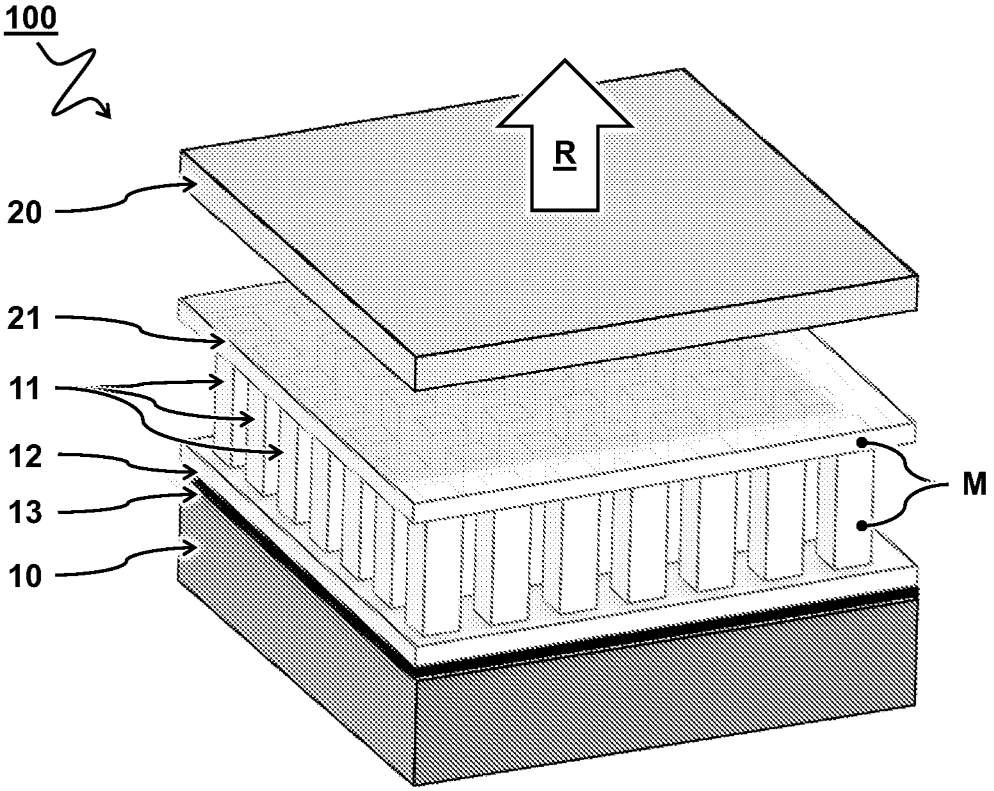
Figure 3B:
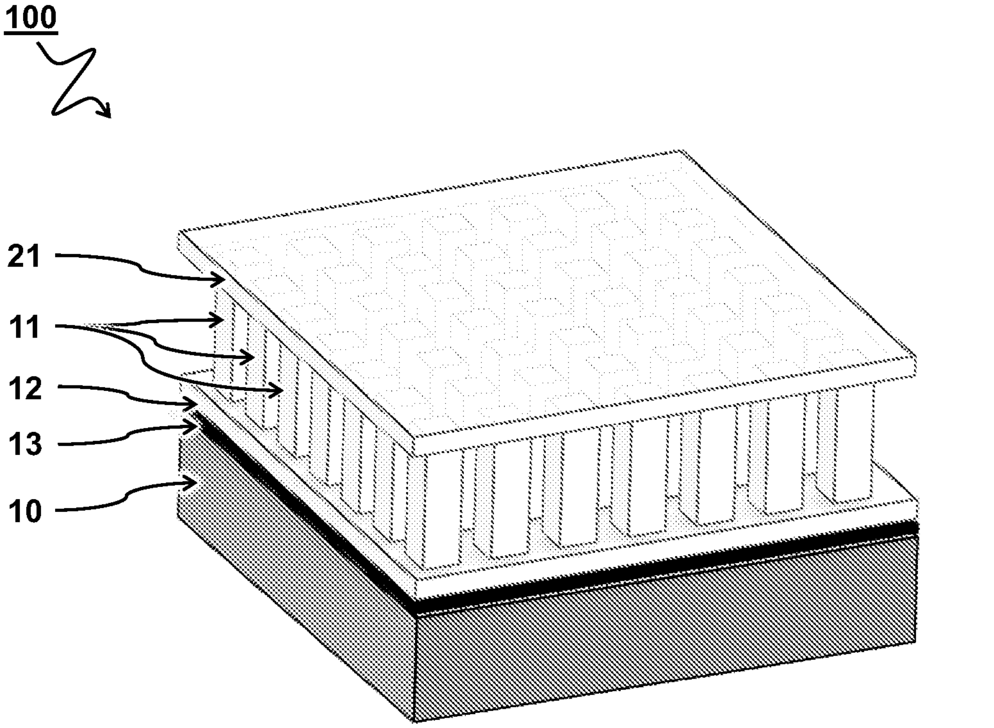

FIGS. 3A and 3B illustrate an embodiment removing the second substrate 20. In one embodiment, the second substrate 20 is removed (R) leaving the solidified piezoelectric layer 21 as a platform bridging the respective ends of the pillars 11. For example, this may reveal a uniform and flat surface on top of the platform. In some embodiments, electronic connections can be placed afterwards directly on the piezoelectric layer 21, which then forms an integral part with the pillars 11. Using a flexible, e.g. bendable, substrate as the second substrate may facilitate its removal. For example, a plastic or other flexible material is used. Alternatively to removing, it can be envisaged that the second substrate 20 remains attached to the piezoelectric layer 21. For example, the second substrate 20 may already include electrical connections and/or layers between the second substrate 20 and the piezoelectric layer 21 (not shown). These integrated connection on the second substrate 20 can then be used, e.g. to apply a respective voltage to the pillars 11. For example, the second substrate 20 can have an integrated second electrode which cooperates with the first electrode 13 on the first substrate 10 to apply an electric field there between.

Figure 4A:
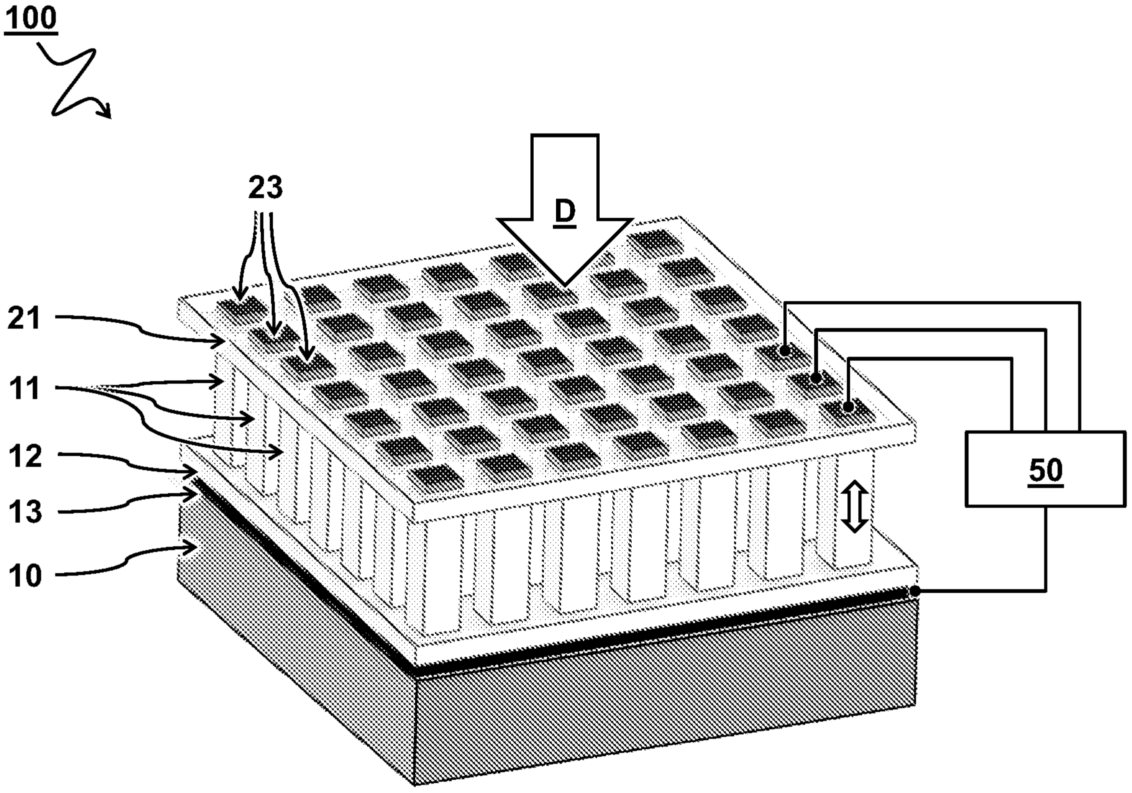
Figure 4B:
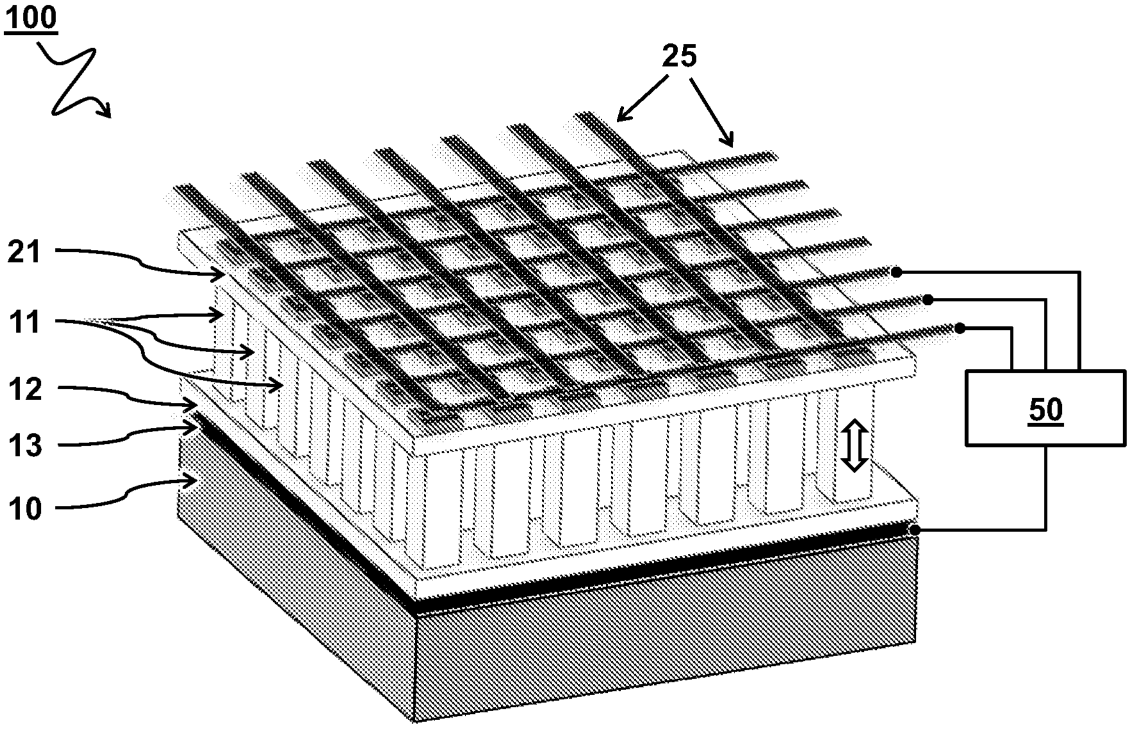

FIGS. 4A and 4B illustrate applying an electric circuit to platform formed by the piezoelectric layer 21. In some embodiments, electrical contacts 23 and/or interconnections 25 are disposed on the piezoelectric layer 21 bridging the pillars 11. For example, these can be used for applying or receiving a respective voltage to or from the piezoelectric material "M". As will be appreciated, the platform formed by the piezoelectric layer 21 integrated with the pillars 11 may greatly facilitate deposition of the contacts 23 and/or interconnections 25.

In some embodiments, the first substrate 10 is flipped over (e.g. with the first substrate 10 back on the bottom) after the piezoelectric layer 21 on the second substrate 20 is solidified. In this way the piezoelectric layer 21 can form a platform on top of the pillars 11 facing upwards onto which platform subsequent connections or components are deposited. By providing a level platform on top of the pillars 11 various subsequent deposition methods can be facilitated. In a preferred embodiment, electrical contacts 23 (or other components and structures) are deposited onto the piezoelectric layer 21 by lithography. For example, this may include depositing further layers of material on top of the piezoelectric layer 21 and exposing to a light pattern for selective formation or removal of structures, e.g. by wet or dry etching techniques. Also other or further deposition techniques can be used such as printing or other transfer, e.g. light induced forward transfer LIFT of structures or components from a donor substrate (not shown).

Piezoelectric devices such as described herein can be used to transmit and/or receive acoustic signals, e.g. ultrasound. For example, a voltage can be applied to generate an electric field through the piezoelectric material "M" of the pillars 11 to actuate a vibration in the pillars. Alternatively, or in addition, a voltage can be measured depending on a vibration in the pillars 11, e.g. caused by an external source. In some embodiments, e.g. as shown, a respective one or more of the pillars 11 are connected via respective electrodes 13, 23 to an electrical device 50 configured to transceive electrical signals there between. For example, the electrical device 50 comprises a signal generator and/or sensor device. Also other or further components can be connected such as a controller to determine which one or more of the pillars 11 is addressed.

Figure 5A:
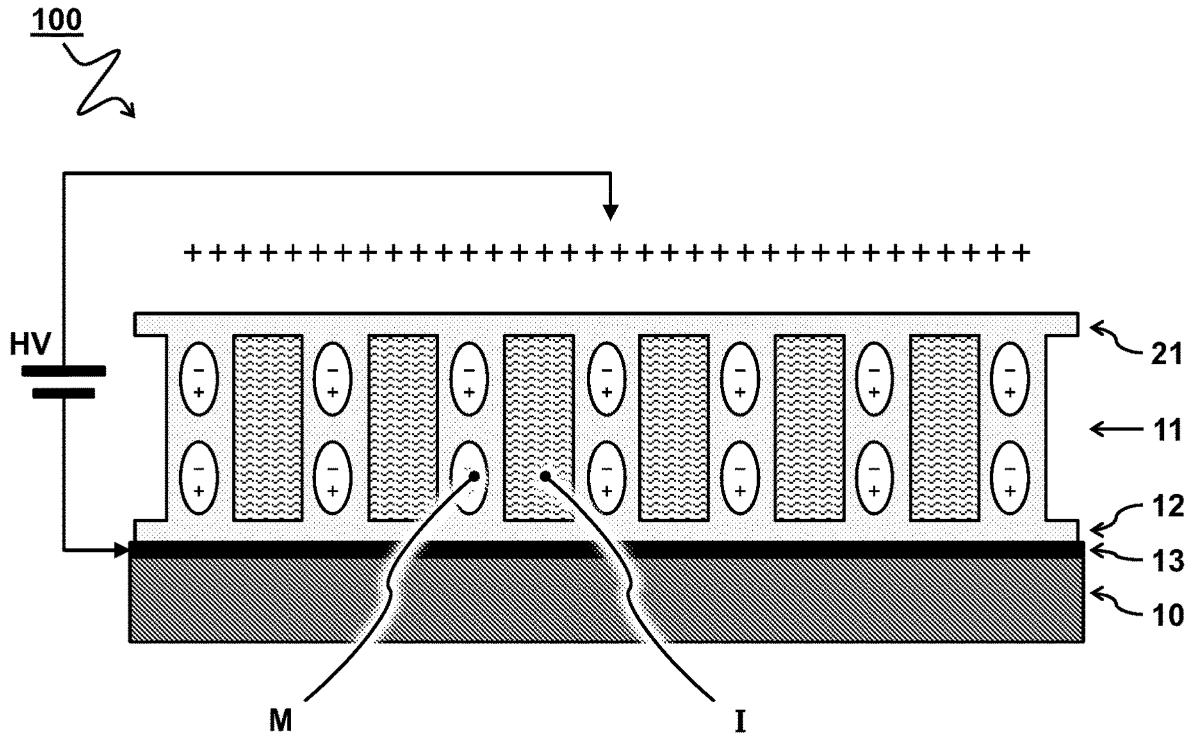
Figure 5B:
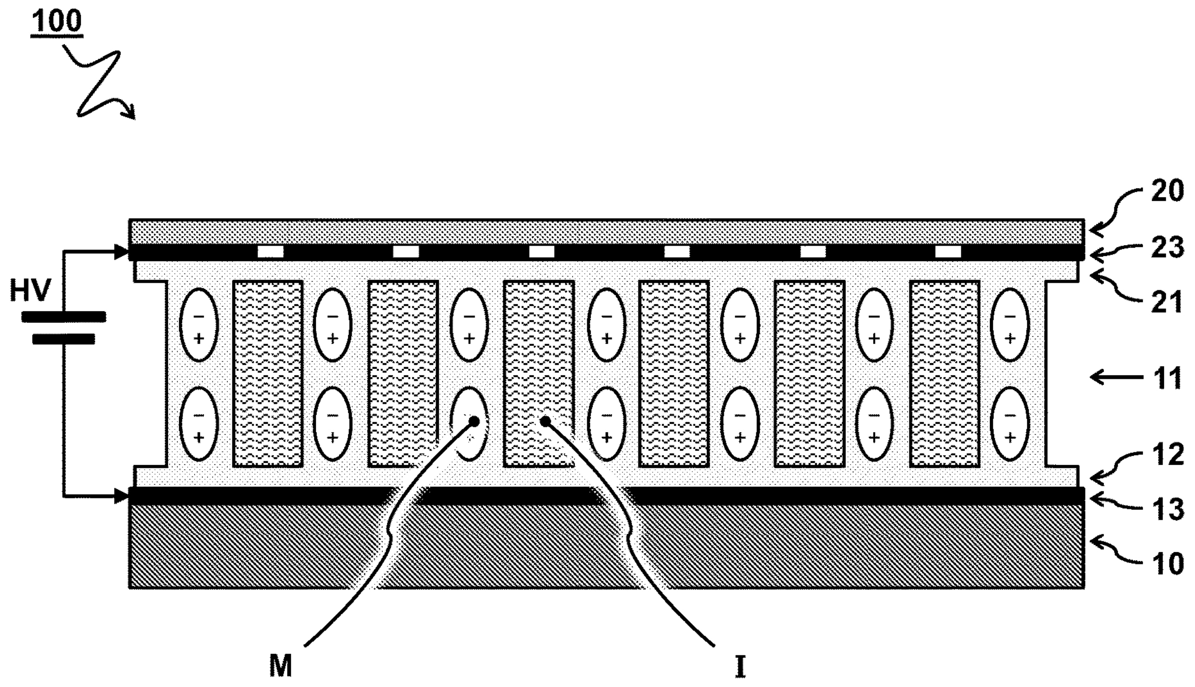

FIGS. 5A and 5B illustrate poling of the piezoelectric material in the pillars 11, the bridge structure formed by the piezoelectric layer 21, and optional second piezoelectric layer 12 on the bottom. In one embodiment, the second piezoelectric layer 12 is also integrally connected to the pillars 11. Accordingly the first piezoelectric layer 21, the pillars 11, and the second piezoelectric layer 12 can all be integrally connected. In a preferred embodiment, the piezoelectric material "M" in the array of pillars 11 is poled by applying a (high) voltage "HV" while an electrically insulating material "I" is provided inside the array in spacing between the pillars 11. Advantageously, the electrically insulating material "I" can be used during the poling to prevent short-circuiting sparks which could damage the device. In some embodiments, the electrically insulating material "I" comprises a fluid, e.g. liquid. Also a solid insulator material can be used. In some embodiments, the electrically insulating material "I" is provided into the spacing between the pillars 11 after the pillars are connected to the piezoelectric layer 21. For example, a liquid or gas can be pumped into the spacing between the pillars. Most preferably, the electrically insulating material "I" is removed after the poling. In this way, the insulating material need not affect the mechanical properties of the array.

In a preferred embodiment, e.g. as shown in FIG. 5A, the pillars 11 are poled by corona poling after the piezoelectric layer 21 is connected to the pillars 11. Without being bound by theory, charges can spread across the piezoelectric layer 21 to cause a more even electric field along a length of the pillars (as opposed to an open structure where charges could also reach the sides of the pillars). Also other ways of poling the piezoelectric material can be envisaged, preferably along a length of the pillars, e.g. by applying high voltage "HV" across respective electrodes 13,23 on either sides of the pillar ends such as shown in FIG. 5B. So it will be understood that the poling can occur at various stages of the manufacturing, e.g. before or after applying the electrodes.

Figure 6:
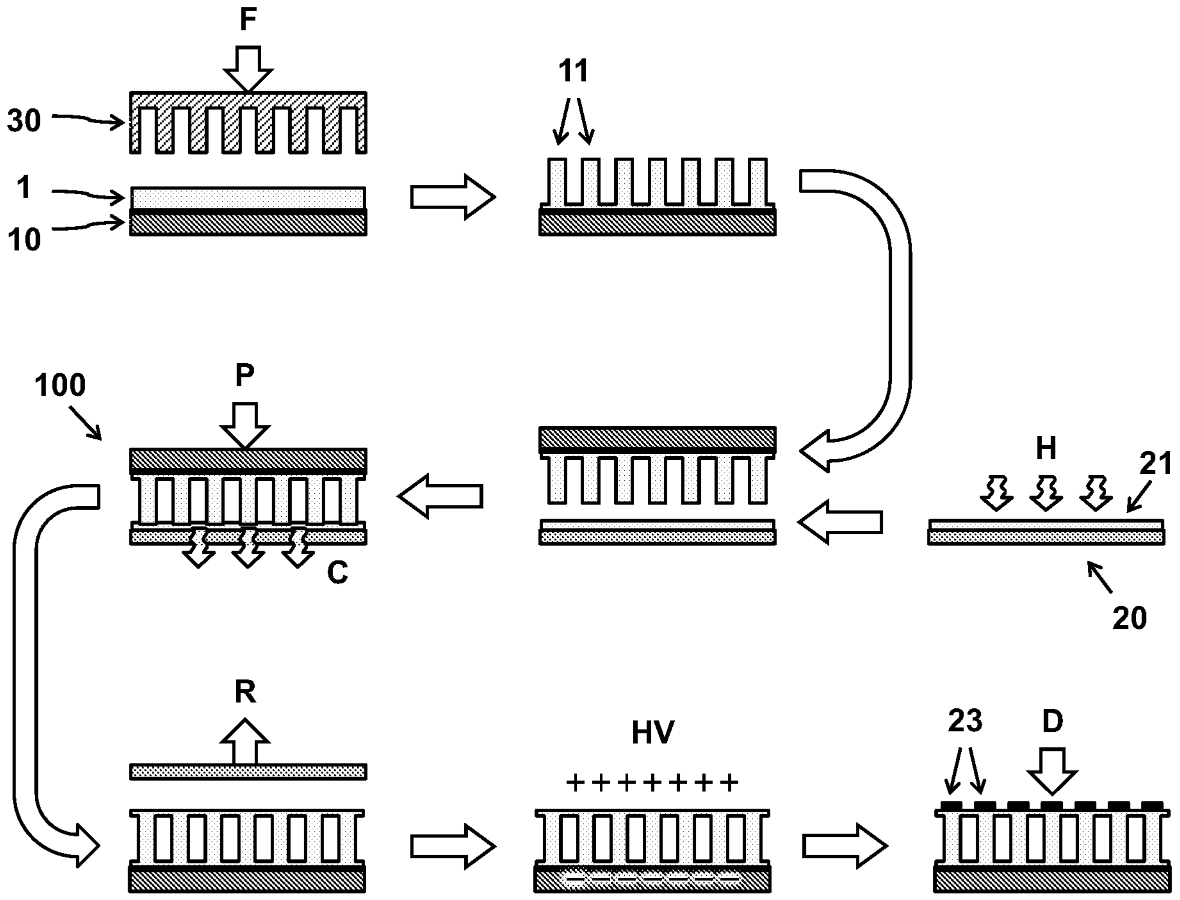

FIG. 6 illustrates a preferred sequence of steps in manufacturing a piezoelectric device 100 as described herein. Of course also other sequences can be envisaged, e.g. adding further steps, removing optional steps, switching steps, et cetera. For example, the array pillars 11 can be manufactured by other methods than molding F. For example, the pillars can be already facing downward while molding, or remain facing upward while connecting to a wet piezoelectric layer 21 (sticking upside down from a the second substrate 20). For example, instead of heating H, the piezoelectric layer 21 can be wetted or liquefied using a solution or uncured material. For example, the pillars 11 can be pushed actively into the piezoelectric layer 21, or vice versa, e.g. by gravity alone or by active pushing. For example, the second substrate 20 can remain on the solidified piezoelectric layer 21. For example, the piezoelectric material can be poled before, during, or after combining the structures. For example, electrical connections can be integrated in respective substrates and/or applied afterwards.

Figure 7A:
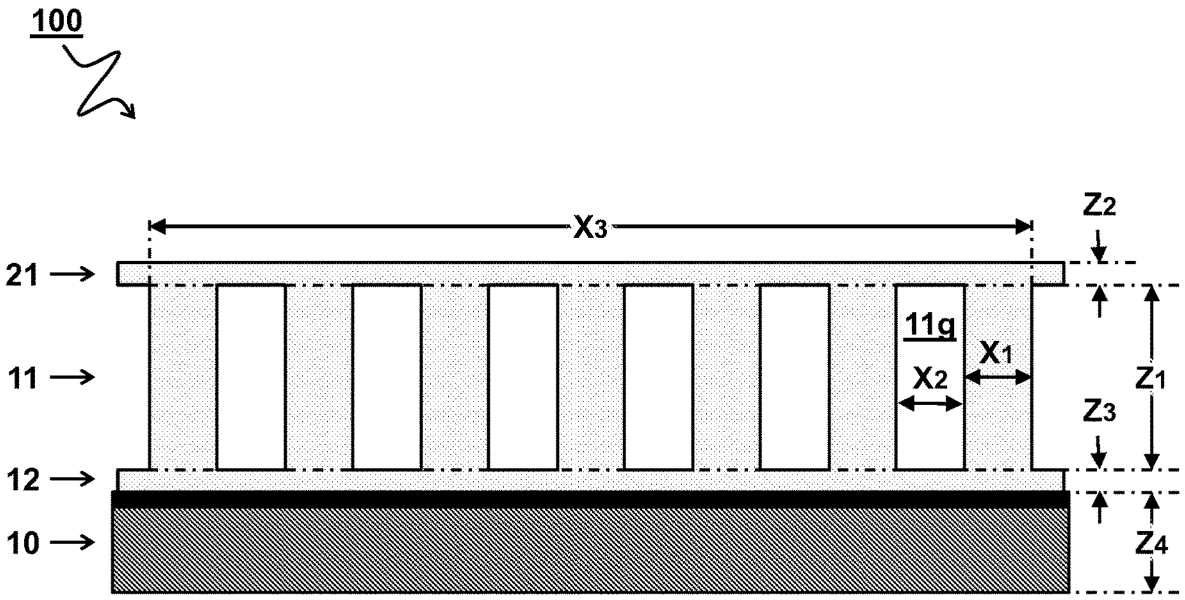
FIG. 7A illustrates a piezoelectric device with various dimensions.
Figure 7B:
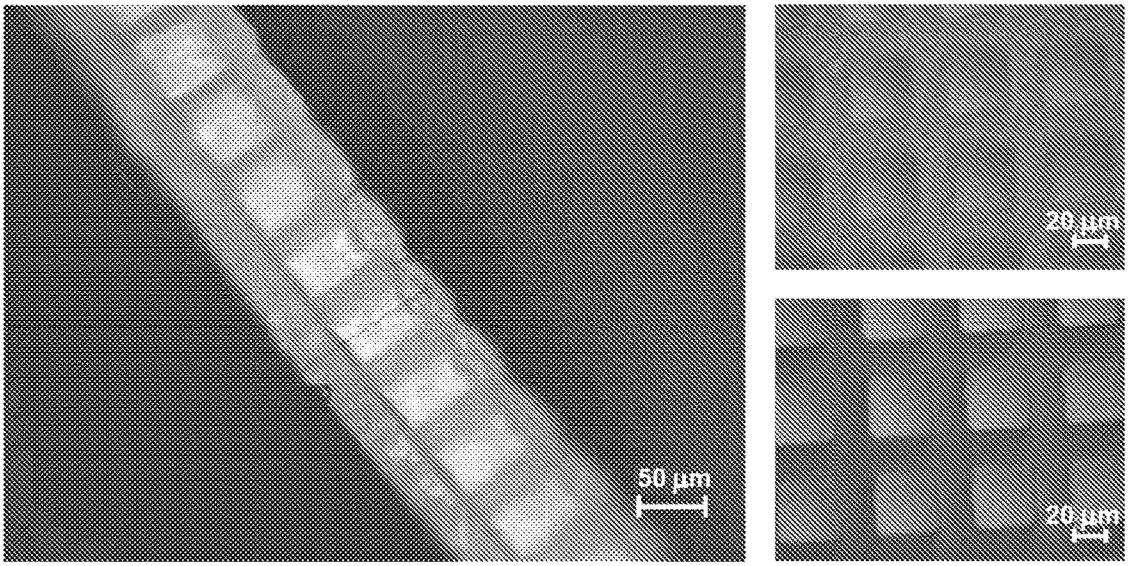
FIG. 7B illustrates photographs of a piezoelectric device fabricated by methods as described herein.

FIG. 7A illustrates a piezoelectric device 100 with various dimensions. FIG. 7B illustrates photographs of a piezoelectric device fabricated by methods as described herein. The left image represents a cross-section view. Images on the right represents top views, with on the top right focus on the piezoelectric bridging layer and on the bottom right focus on the pillar/pockets.

Irrespective of the manufacturing method, the present disclosure can provide advantageous structures and devices. In one embodiment, a piezoelectric device 100 comprises a first substrate 10 with an array of pillars 11 comprising piezoelectric material "M", and a piezoelectric layer 21 integrally connected with the pillars 11 on respective ends of the pillars opposite the first substrate 10. Preferably, the piezoelectric layer 21 forms a bridging structure acting as a platform of piezoelectric material "M" between the respective ends of the pillars 11.

In some embodiments, the piezoelectric device 100 comprises electrical contacts (not shown here) on top of the platform formed by the piezoelectric layer 21. In other or further embodiments, the piezoelectric device 100 comprises a second piezoelectric layer 12 between the pillars 11 and the first substrate 10. In a preferred embodiment, the piezoelectric device 100 comprises a first electrode (not indicated here) between the second piezoelectric layer 12 and first substrate 10. In some embodiments, the piezoelectric device 100 comprises or is coupled to an electrical device (not shown here) configured to transceive electrical signals. For example, the signals are transmitted to and/or received from respective electrodes on either ends of the pillars 11, e.g. via the one or more piezoelectric layer 12,22. The piezoelectric device 100 manufactured and/or structured as described herein can be used for many purposes, most preferably generating or detecting acoustic waves, e.g. in an ultrasound frequency range. For example, the piezoelectric device 100 can be used as part of a medical diagnostic and/or imaging device. Also other uses can be envisaged.

In a preferred embodiment, the pillars 11 have a pillar height "Z1" that is an integer multiple of half a wavelength of a (longitudinal) sound wave in the pillar. The pillar height is preferably chosen such that a natural resonance frequency along a length (height) of the pillar matches a frequency of sound to be emitted or received. In this way, the waves may resonate in the pillar increasing efficiency. For example, the resonance frequency may be determined by circumstances such as a stiffness of the material, a shape of the pillar, the substrate (this may give a lambda/2 or lambda/4 resonator). As an example, a hundred micron PVDF-TrFE pillar is used which in combination with the substrate has a resonance frequency around ten Megahertz. Of course also other dimensions, material, and frequencies can be attained. For example, dimensions for the pillar height "Z1" may typically vary between five micrometer and three hundred micrometer, preferably between ten micrometer and two hundred micrometer. For example, the piezoelectric device is used in ultrasound applications.

In a preferred embodiment, the pillars 11 have a pillar height "Z1" and a pillar width "X1", wherein the pillar height "Z1" is more than the pillar width "X1" by at least a factor two. The higher the aspect ratio, the more the pillars can act as one dimensional structures. For example, this may improve separation between lateral and axial resonance modes. On the other hand the length may preferably chosen equal to half the wavelength while the thickness or width of the pillars is preferably not so small that the structural integrity is compromised. Also the manufacturing method may limit the minimal width. For example, the ratio "Z1"/"X1" is typically between one-and-half and ten, preferably more than three or four.

In a preferred embodiment, the pillars 11 are spaced apart by a gap 11*g* there between. In principle, it may be sufficient that the gap is a few micrometers, e.g. more than five micrometers, to provide sufficient damping of coupling between pillars. Typically, the distance "X2" between the pillars is similar to the pillar width "X1", e.g. differing by less than a factor three, preferably less than a factor two, or less than fifty percent difference. For example, both the pillar width "X1" and the distance "X2" are in a typical range between five micrometer and hundred micrometer. In some embodiments, the distance "X2" is selected such that lamb waves (e.g. AO surface waves) through the piezoelectric layer 21 do not constructively interfere with the next pillar so they can be independent. In some embodiments, e.g. for imaging, a pitch between the pillars (X1+X2) is preferably less than half a wavelength of the ultrasonic waves. The pitch can also be bigger, e.g. for other applications.

A total surface dimension "X3" of the piezoelectric layer 21 is typically much higher than the pitch ("X1"+"X2") according to which the pillars are spread. For example, "X3" can be higher than ("X1"+"X2") by at least a factor five or ten. In some embodiments, the array comprises at least ten pillars, preferably at least twenty, at least fifty, at least a hundred, at least thousand, at least ten thousand, e.g. up to a million, or more. For example, the piezoelectric device comprises an array of two hundred by two hundred pillars at a pitch of fifty microns, spread over a surface of one square centimeter.

Preferably, a thickness "Z2" of the piezoelectric layer 21 is on the one hand thick enough to allow the pillars 11 to sink at least some distance into the layer for connection and/or provide a sufficient platform structure for subsequent processing; and on the other hand not so thick as to interfere with the actuating of the pillars or a desired one-dimensional behavior of the combined structure. Typically, a length "Z1" of the pillars 11 is higher than a thickness "Z2" of the piezoelectric layer 21 by at least a factor two or three, preferably at least a factor five, more preferably e.g. up to a factor ten, twenty, or more.

Typically the thickness "Z2" of the piezoelectric layer 21 is around ten percent of the pillar height "Z1". In some embodiments, the thinner the piezoelectric layer 21 compared to the pillar height "Z1", the less cross-talk can be expected between the pillars. In other or further embodiments, a thicker piezoelectric layer 21 can be useful to allow passing a surface wave along a bridge or platform formed by the piezoelectric layer 21, e.g. for interference. Also mechanical stability of the bridge can be better when the piezoelectric layer 21 is thicker. For example, the thickness "Z2" of the piezoelectric layer 21 is between one and thirty micrometers, preferably between five and twenty micrometers.

In some embodiments, the structure of the pillars may be supported by a second piezoelectric layer 12 on the other end. The thickness Z3 of this second piezoelectric layer 12 can typically be similar or the same as the thickness "Z2" of the first piezoelectric layer 21, e.g. within a factor three or two difference, most preferably as symmetric as feasible.

Typically, the first substrate 10 has a thickness "Z4" which is more than a thickness of the piezoelectric layer 21, more than a length "Z1" of the pillars, or even more than the combined structure. For example, the first substrate 10 has a thickness of at least half a millimeter, more than a millimeter, e.g. up to half a centimeter, or more. The second substrate (not shown here) may have similar thickness as the first substrate 10, or different thickness, e.g. less than the first substrate 10.

FIGS. 8A-8E illustrate another embodiment for manufacturing the piezoelectric device 100 as described herein.

Figure 8A:
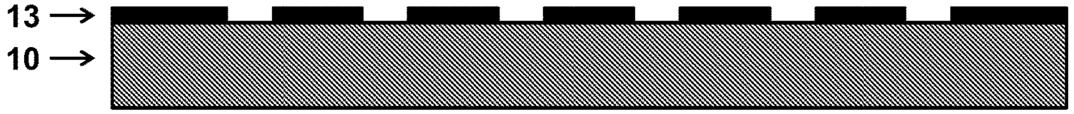
FIGS. 8A-8E illustrate a piezoelectric device with an anchoring structure for improving adhesion of piezoelectric material.
Figure 8B:
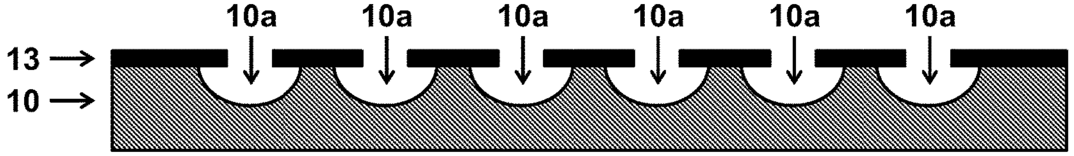

In some embodiment, e.g. as illustrated in FIG. 8B, the first substrate 10 is provided with an anchoring structure 10*a*. For example, the anchoring structure 10*a* can be used to facilitate or improve adhesion of a subsequent layer deposited onto the first substrate 10. In one embodiment, the anchoring structure 10*a* is formed by etching a set of cavities into the first substrate 10. For example, the first substrate 10 comprises or is essentially formed of a polymer material that can be etched away. Also other material can be used. Typically, the etching process is guided by an etching mask. For example, as illustrated in FIG. 8A, the etching mask can be advantageously formed, at least in part, by a pattern of the bottom electrode 13. Also other or further etching mask structures can be used at the location of the electro and/or at other locations on the first substrate 10, e.g. adjacent the bottom electrode 13. In a preferred embodiment, the set of cavities at least partially undercuts the etching mask, e.g. runs partially below the electrodes. This may further improve adhesion, in particular allow the subsequent layer to remain attached to the first substrate 10 also in case of substantial bending. Alternatively, or in addition to etching, the anchoring structure 10*a* can also be formed in other ways, e.g. by the structure of the bottom electrode itself, or another structure disposed on the first substrate 10 and connected to the first substrate to help keep the subsequent layer adhered.

Figure 8C:
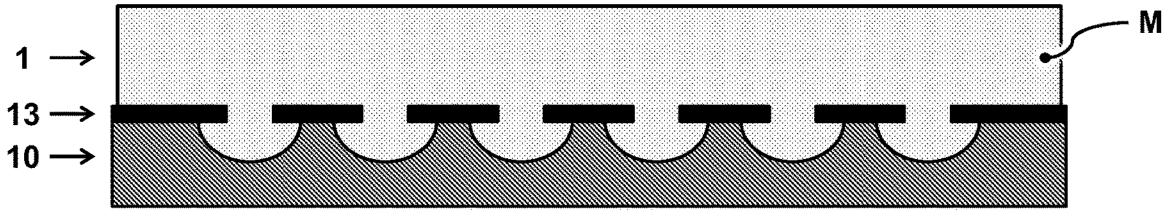
Figure 8D:
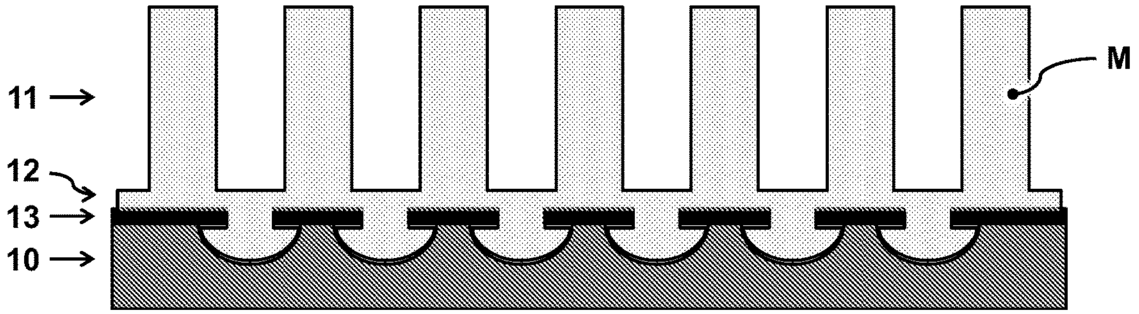
Figure 8E:
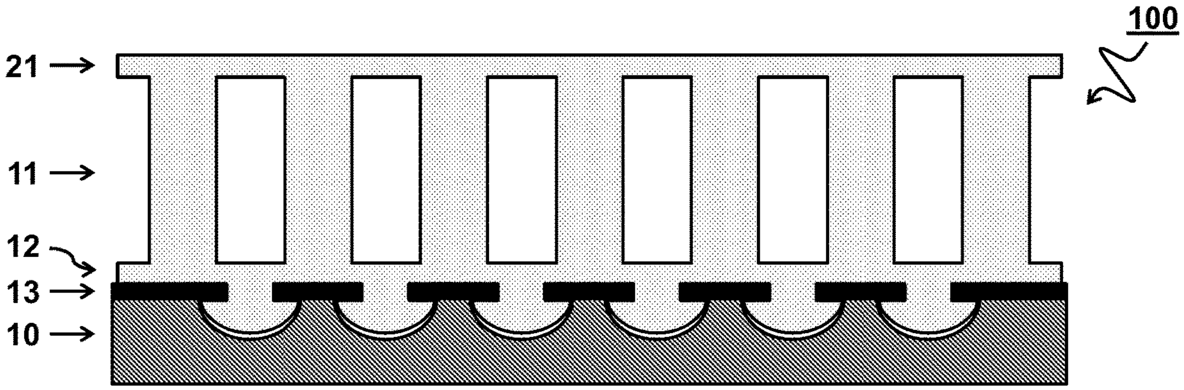

In some embodiments, e.g. as illustrated in FIG. 8C, the subsequent layer is provided onto the first substrate 10 after forming the anchoring structure 10*a*. Preferably, the subsequent layer is initially provided in (at partially) liquid form. In this way the subsequent layer can flow or more easily be pushed into the anchoring structure 10*a*. When the material of the subsequent layer has flowed and/or been pushed into the cavities, the material can be at least partially solidified, e.g. cured. Most preferably, the subsequent layer comprises a piezoelectric material M which can form the precursor layer 1, as described earlier e.g. with reference to FIG. 1A. For example, the precursor layer 1 comprises or is essentially formed of a polymer piezoelectric material, such as P(PVDF-TrFE) that is, that is initially applied in liquid form. In one embodiment, the precursor layer 1 is molded to form the pillars 11 of piezoelectric material M, e.g. as shown in FIG. 8D. For example, the molding process may involve pushing a mold structure 30 into the precursor layer 1. This may also help to (further) push the piezoelectric material M into the anchoring structure 10*a*. Also other ways of forming the pillars 11 can be envisaged. In another or further embodiment, e.g. as shown in FIG. 8E, a piezoelectric layer 21 is integrally connected to the pillars 11, e.g. forming a bridging structure between the respective ends of the pillars. For example, the piezoelectric layer 21 can be provided as described as described with reference to FIGS. 2A-3B.

For the purpose of clarity and a concise description, features are described herein as part of the same or separate embodiments, however, it will be appreciated that the scope of the invention may include embodiments having combinations of all or some of the features described. For example, while embodiments were shown for forming various layers and components of a piezoelectric device, also alternative ways may be envisaged by those skilled in the art having the benefit of the present disclosure for achieving a similar function and result. E.g. layers and structures may be combined or split up into one or more alternative components. The various elements of the embodiments as discussed and shown offer certain advantages, such as the manufacturing and use of piezoelectric devices having robust structures compatible with various manufacturing and post-processing steps.

In some embodiments, the piezoelectric device as described herein is used for non-contact mixing of liquids, e.g. by acoustic streaming to enable low shear high mass flow. In one embodiment, the piezoelectric device comprises a flexible substrate. For example, the flexible substrate can form part of, or be applied to, a flexible bag containing a liquid to be mixed. For example, the bag comprises a flexible (bio)reactor and/or the liquid comprises a biological liquid such as a medicinal liquid, in particular vaccine, which can benefit from (continued or intermittent) mixing. Advantageously the large area flexible ultrasound transducer or substrate can be integrated or patched (re-useable), e.g. the flexible acoustic device can be conformal to the bag ensuring good coupling. Also the bag with integrated acoustic device can be easily packaged, e.g. substantially flattened (when empty) without sharp/rigid objects inside the bag. Alternative to the use in flexible containers, the rigid or flexible piezoelectric device can also form part of, or be integrated into, a wall of a rigid container for mixing or other purposes, e.g. sensing. Also other applications of flexible and/or rigid piezoelectric devices/substrates can be envisaged. Of course, it is to be appreciated that any one of the above embodiments or processes may be combined with one or more other embodiments or processes to provide even further improvements in finding and matching designs and advantages. It is appreciated that this disclosure offers particular advantages to piezoelectric transducers used for sensing or actuating relatively large and/or flexible surfaces, and in general can be applied for any application wherein a piezoelectric device is used.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. A use of a piezoelectric device for generating or detecting acoustic waves, the piezoelectric device comprising a first substrate with an array of pillars comprising piezoelectric material, a first piezoelectric layer integrally connected with the array of pillars on respective first ends of the array of pillars between the first substrate and the array of pillars, wherein the first piezoelectric layer forms a base structure between the respective first ends of the array of pillars, and a second piezoelectric layer integrally connected with the array of pillars on respective second ends of the array of pillars opposite the first substrate, wherein the second piezoelectric layer forms a bridging structure acting as a platform of piezoelectric material between the respective second ends of the array of pillars.

2. A piezoelectric device comprising a first substrate with an array of pillars comprising piezoelectric material, a first piezoelectric layer integrally connected with the array of pillars on respective first ends of the array of pillars between the first substrate and the array of pillars, wherein the first piezoelectric layer forms a base structure between the respective first ends of the array of pillars, and a second piezoelectric layer integrally connected with the array of pillars on respective second ends of the array of pillars opposite the first substrate, wherein the second piezoelectric layer forms a bridging structure acting as a platform of piezoelectric material between the respective second ends of the array of pillars.

3. The piezoelectric device according to claim 2, comprising:

a first electrode between the first piezoelectric layer and first substrate, electrical contacts forming at least one second electrode on top of the platform formed by the second piezoelectric layer, and an electrical device configured to transceive electrical signals of the first electrode and the at least one second electrode for generating and/or measuring of acoustic waves.

4. The piezoelectric device according to claim 2, wherein the second piezoelectric layer has a first thickness between one and thirty micrometers.

5. The piezoelectric device according to claim 4, wherein the first piezoelectric layer has a second thickness that is similar or the same as the first thickness of the second piezoelectric layer within a factor three difference.

6. The piezoelectric device according to claim 2, wherein the first substrate has a third thickness of at least half a millimeter.

7. The piezoelectric device according to claim 2, wherein the array of pillars have a pillar height between five micrometer and three hundred micrometer.

8. The piezoelectric device according to claim 2, wherein the array of pillars have a pillar height and a pillar width, wherein the pillar height is more than the pillar width by at least a factor two.

* * * * *